United States Patent
Kim (10) Patent No.: US 10,296,070 B2
(45) Date of Patent: May 21, 2019

(54) POWER-GATING CONTROL AND METHOD

(71) Applicant: WINBOND ELECTRONICS CORPORATION, Taichung (TW)

(72) Inventor: Young Tae Kim, San Ramon, CA (US)

(73) Assignee: Winbond Electronics Corporation, Taichung (TW)

(*) Notice: Subject to any disclaimer, the term of this patent is extended or adjusted under 35 U.S.C. 154(b) by 254 days.

(21) Appl. No.: 15/441,615

(22) Filed: Feb. 24, 2017

(65) Prior Publication Data

US 2018/0246560 A1    Aug. 30, 2018

(51) Int. Cl.
| | |
|---|---|
| G06F 1/32 | (2006.01) |
| G06F 1/26 | (2006.01) |
| G06F 1/3287 | (2019.01) |
| G06F 1/3296 | (2019.01) |
| G11C 5/14 | (2006.01) |

(52) U.S. Cl.
CPC .......... *G06F 1/3287* (2013.01); *G06F 1/3296* (2013.01); *G11C 5/148* (2013.01); *G06F 1/26* (2013.01)

(58) Field of Classification Search
CPC ..................... G06F 1/32; G06F 1/26
See application file for complete search history.

(56) References Cited

U.S. PATENT DOCUMENTS

| | | | |
|---|---|---|---|
| 9,059,696 B1* | 6/2015 | Rahman | H03K 19/0013 |
| 2005/0099156 A1* | 5/2005 | Brenner | H02J 7/0036 |
| | | | 320/116 |
| 2008/0112250 A1 | 5/2008 | Freebern | |
| 2012/0086402 A1* | 4/2012 | Carder | H02J 1/108 |
| | | | 320/118 |
| 2013/0320772 A1* | 12/2013 | Qiao | H01M 10/04 |
| | | | 307/87 |
| 2015/0185801 A1* | 7/2015 | Arora | G06F 1/3287 |
| | | | 713/320 |
| 2017/0352320 A1* | 12/2017 | Lin | G09G 3/3677 |

FOREIGN PATENT DOCUMENTS

| | | |
|---|---|---|
| CN | 103426466 A | 12/2013 |
| TW | I341536 | 5/2011 |

* cited by examiner

*Primary Examiner* — Phil K Nguyen
(74) *Attorney, Agent, or Firm* — Finnegan, Henderson, Farabow, Garrett & Dunner LLP (57) ABSTRACT

A power-gating electronic system for synchronized power transitions, includes a power generation block including a plurality of cells, each cell including a cell enabling input; a circuit block including a plurality of circuits, each circuit including a circuit enabling input; and a power-gating controller including a plurality of gate signal outputs. In the power-gating electronic system, each gate signal output is coupled to one of the cell enabling inputs and one of the circuit enabling inputs.

18 Claims, 7 Drawing Sheets

POWER-GATING CONTROL AND METHOD

FIELD OF THE DISCLOSURE

The present disclosure relates to a power-gating electronic system and a power-gating method and, more particularly, to a power-gating electronic system for performing a power transition.

BACKGROUND

Power-gating is a method used to reduce power consumption of electronics in which inactive circuits (or inactive portions of a circuit) are disconnected from the power supply. For example, when a mobile phone is on standby and awaiting calls, circuits associated with calls may be disconnected from power and/or ground rails using switches. Disconnecting or "powering down" circuits may reduce the current being dissipated through the circuit, minimize power consumption, and lead to improved battery lifespan. When a powered down circuit is required for an operation (e.g., a phone call is received), the circuit is re-connected to the power supply or "powered up."

Circuits being operated with power-gating techniques, e.g., to power down or power up the circuits, may suffer from noise and current surges during a power transition. As instantaneous charge current passes through a switching device or voltage generators being activated, differences in power supply and demand cause current fluctuations and noise. Such noise may be associated to self-inductance of bonding wires, parasitic inductance of power rails, and/or dynamic impedances that affect the stability of the power source. Noise resulting from power-gating may have undesirable consequences in the operation of a circuit. For example, if the noise associated with a power transition is greater than the noise tolerance of a circuit, that circuit may erroneously latch an incorrect value and/or perform an unintended operation.

SUMMARY

One aspect of the present disclosure is directed to a power-gating electronic system. The power-gating electronic system includes a power generation block including a plurality of cells, each cell including a cell enabling input; a circuit block including a plurality of circuits, each circuit including a circuit enabling input; and a power-gating controller, which includes a plurality of gate signal outputs. Each gate signal output is coupled to one of the cell enabling inputs and one of the circuit enabling inputs.

Another aspect of the present disclosure is directed to a power-gating controller. The power-gating controller includes a memory device, a control unit; and a plurality of gate signal outputs. The memory device stores instructions that, when executed by the control unit, cause the control unit to determine a waiting time interval for gate signal output generation, and sequentially generate a plurality of gate signals based on the determined waiting time interval. Each gate signal is provided on a distinct one of the plurality of gate signal outputs.

Yet another aspect to the present disclosure is directed to a method for operating a power-gating electronic system. The method includes determining a waiting time interval for gate signal generation; determining a number of circuits to enter a powered down mode; and sequentially generating a plurality of gate signals based on the determined waiting time interval, each gate signal being provided on a distinct one of a plurality of gate signal outputs of a power-gating controller. Each gate signal output is coupled to one cell enabling input of a cell in a power generation block and one circuit enabling input of a circuit in a circuit block.

DETAILED DESCRIPTION

The disclosure is generally directed to a power-gating electronic system that controls timing of power transitions to minimize noise. In some embodiments, the power-gating electronic system includes a power-gating controller that generates gate-signals. The power-gating controller is coupled with cells from a power block and circuits from a circuit block. For example, an output from the power-gating controller may be connected to one circuit and one cell. Such configuration controls timing to, for example, synchronize power demand and power supply during a power transition by controlling timing to, for example, simultaneously activate or deactivate a cell and a circuit. The power-gating controller may also be configured to generate the gate-signals sequentially. To segment power transitions and minimize noise, the power-gating controller may generate individual gate-signals when a waiting time interval lapses. The power-gating controller may also include functions to dynamically determine the waiting time interval. In some embodiments, the power-gating electronic system may be configured to have equivalent electrical distances between outputs and inputs.

Reference will now be made in detail to the present embodiments, examples of which are illustrated in the accompanying drawings. Wherever possible, the same reference numbers will be used throughout the drawings to refer to the same or like parts.

Figure 1:
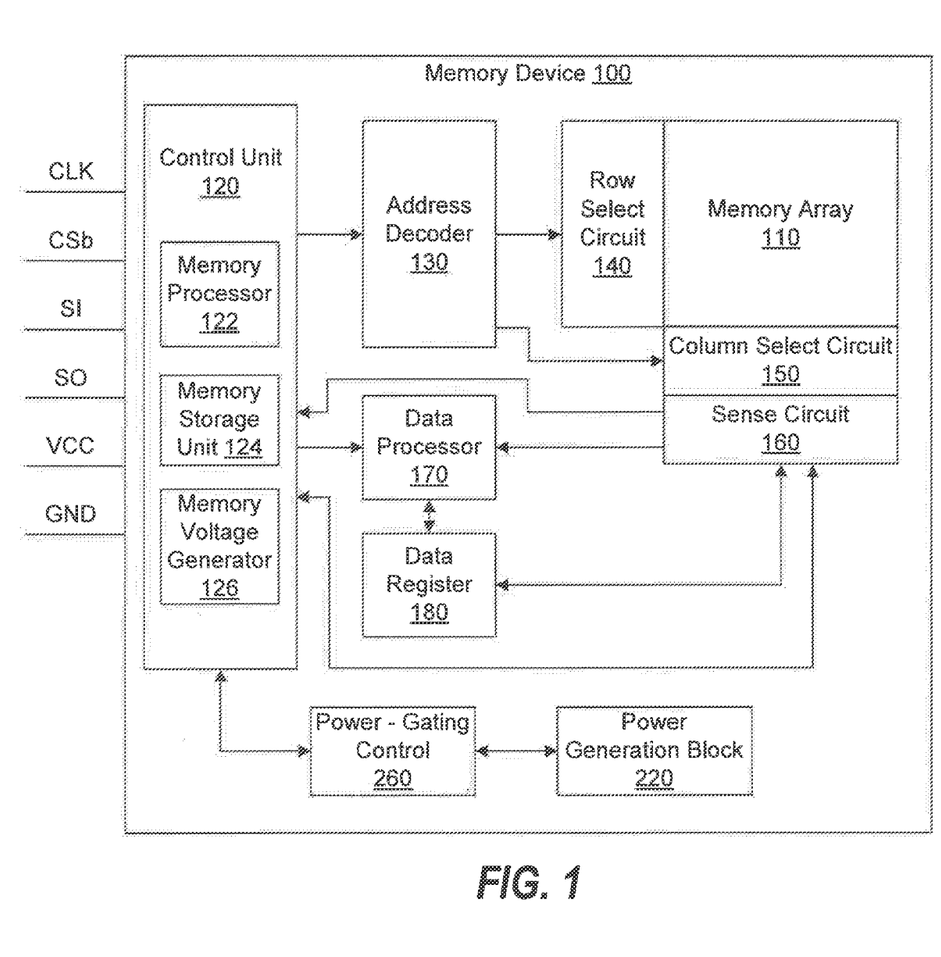
FIG. 1 is a schematic diagram of an exemplary memory device, according to one embodiment.

FIG. 1 is a schematic diagram of an exemplary memory device, according to one embodiment. Memory device 100 can be a non-volatile memory device such as, for example, a flash memory device, a Resistive Random Access Memory (ReRAM) device, or a Magnetoresistive Random Access Memory (MRAM) device. Memory device 100 includes a memo array 110, a control unit 120, an address decoder 130, a row select circuit 140, a column select circuit 150, a sense circuit 160, a data processor 170, and a data register 180. In some embodiments, memory device 100 also includes a power generation block 220 and a power-gating control 260. Memory device 100 also includes a plurality of pins for communicating with an external device (not shown), such as a clock (CLK) pin, a chip select (CSb) pin, a serial input (SI) pin, a serial output (SO) pin, a power (VCC) pin, and a ground (GND) pin.

Memory array 110 includes a plurality of memory cells (not shown) arranged in rows and columns between a plurality of word lines (not shown) and a plurality of bit lines (not shown). The gates of each row of memory cells are commonly connected to a respective one of the plurality of word lines. Each column of memory cells is connected to a respective one of the plurality of bit lines.

Control unit 120 is coupled to the plurality of pins, and is configured to receive commands, addresses, and input data transmitted from the external device via the SI pin and to control operations of various components of memory device 100, such as address decoder 130, row select circuit 140, column select circuit 150, sense circuit 160, and data processor 170 in response to the commands. In the embodiment illustrated in FIG. 1, control unit 120 includes a memory processor 122, a memory storage unit 124, and a memory voltage generator 126. Memory storage unit 124 is configured to store instructions executed by memory processor 122 to control operations of the various components of memory device 100 in response to the commands. Memory processor 122 is a general-purpose processor that can be configured to execute the instructions stored in memory storage unit 124. Memory voltage generator 126 is configured to generate various voltages for controlling the operations of the various components of memory device 100. In an alternative embodiment, control unit 120 can include special-purpose logic circuits that are configured to control operations of the various components of memory device 100.

Address decoder 130 is coupled to control unit 120, row select circuit 140, and column select circuit 150, and is configured to receive a memory address transferred from control unit 120 and decode the received address to obtain a row address and a column address in memory array 110. Address decoder 130 is also configured to transfer the row address to row select circuit 140 and the column address to column select circuit 150.

Row select circuit 140 is coupled to memory array 110 and is configured to receive the row address from address decoder 130, and to supply word line voltages to the word lines of memory array 110 to select at least one-word line according to the row address.

Column select circuit 150 is coupled to memory array 110 and is configured to receive the column address from address decoder 130, and to supply bit line voltages to the bit lines of memory array 110 to select at least one-bit line according to the column address.

Sense circuit 160 is coupled to memory array 110 and is configured to read array data stored in memory array 110, and transfer the array data to control unit 120 or to data processor 170.

Data processor 170 is coupled between control unit 120 and sense circuit 160, and is configured to receive input data from control unit 120 and array data from sense circuit 160, process the input data based on the array data to generate processed data, and write the processed data into data register 180. Data processor 170 is also configured to read data from data register 180.

Data register 180 is coupled to data processor 170 and is configured to store data to be written into memory array 110. For example, data register 180 stores processed data generated by data processor 170. Data register 180 is also configured to store data read from memory array 110.

Although control unit 120, address decoder 130, row select circuit 140, column select circuit 150, sense circuit 160, data processor 170, and data register 180 are illustrated as separate components, those skilled in the art will now recognize that two or more of these components can be combined into one circuit.

Power generation block 220 and power-gating control 260 may be coupled with each other and with control unit 120. Alternatively, in some embodiments, power generation block 220 and power-gating control 260 may be directly coupled to each one of the components of memory device 100 (connections not shown). Power-gating control 260 is configured to receive instructions from control unit 120 and generate gating signals. Power generation block 220 is configured to supply power to other components of memory device 100 and receive signals from power-gating control 260.

Figure 2A:
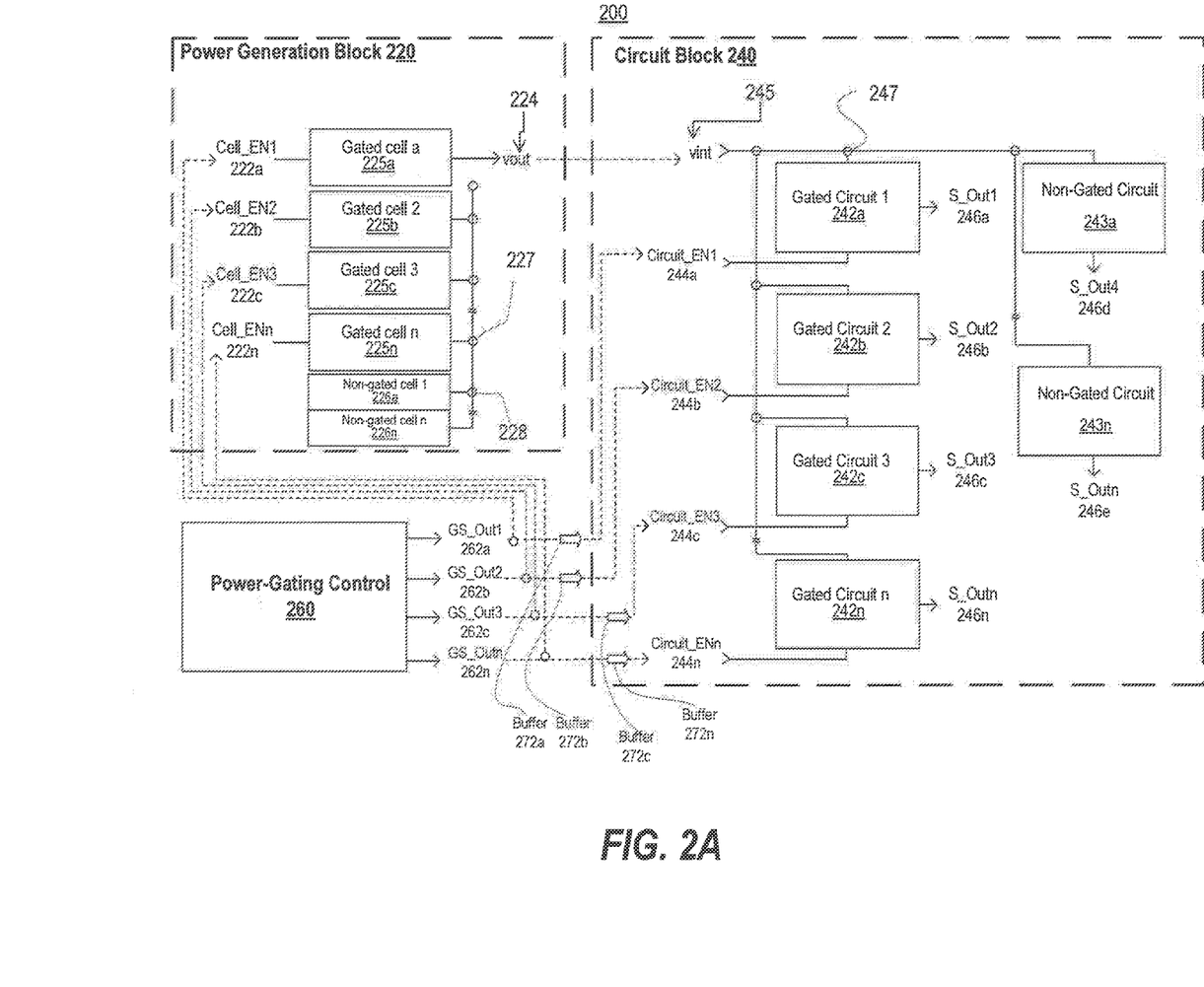
FIG. 2A is a schematic diagram of an exemplary power-gating electronic system.

FIG. 2A is a schematic diagram of an exemplary power-gating electronic system 200. Power-gating electronic system 200 includes power-gating control 260, power generation block 220, and a circuit block 240. In some embodiments, power-gating electronic system 200 may be part of memory device 100. In such embodiments, circuit block 240 may represent one of the components of memory device 100. For example, circuit block 240 may be included with memory array 110. However, in other embodiments, power-gating electronic system 200 may be part of a different device, such as a microcontroller or a personal computer. In yet other embodiments, power-gating electronic system 200 may not be part of any device and be a standalone system.

Power generation block 220 includes a plurality of power cells including gated cell 225a, 225b, . . . , 225n, collectively referred to herein as gated cells 225, and non-gated cell 226a . . . 226n, collectively referred to herein as non-gated cells 226. Gated cells 225 include output gated pins 227 and non-gated cells 226 include output non-gated pins 228 that are configured to provide current to a circuit. For the purpose of this application, output gated pins 227 and non-gated pins 228 may also be referred as cell power outputs. Gated cells 225 include cell enabling pin 222a, 222b, . . . 222n, collectively referred to herein as cell enabling pins 222. In some embodiments, gated pins 227 and output non-gated pins 228 are coupled to a voltage output node 224.

In some embodiments, all of gated cells 225 and non-gated cells 226 of power generation block 220 have the same output capacity. In other embodiments, all gated cells 225 have the same power output capacity while non-gated cells 226 have a different output capacity. In yet other embodiments gate cells 225 have respective different output capacities.

In some embodiments, power generation block 220 may also include transformers, voltage regulators, voltage-level translators, rectifiers, and capacitors. In some embodiments, power generation block 220 may be a battery system and each cell may be a battery cell.

Circuit block 240 includes a plurality of circuits including gated circuit 242a, 242b, . . . , 242n, collectively referred to herein as gated circuits 242, and non-gated circuit 243a, . . . , 243n, collectively referred to herein as non-gated circuits 243. In some embodiments gated circuits 242a, 242b, . . . , 242n, respectively include circuit enabling pin 244a, 244b, . . . , 244n, collectively referred to herein as circuit enabling pins 244. Each one of the gated circuits 242 and each one of the non-gated circuits 243 include signal output pin 246a, 246b, . . . , 246n, collectively referred to herein as signal output pins 246, and a power supply pin 247. For purposes of this application, power supply pins 247 may also be referred as circuit power inputs. In some embodiments some or all of the power supply pins 247 are connected to a single voltage input node 245.

In some embodiments, all gated circuits 242 and non-gated circuits 243 have the same current demand. In other embodiments all gated circuits 242 may have the same current demand while non-gated circuits 243 have a different current demand. In yet other embodiments, respective gated circuits have different current demands.

In some embodiments, voltage input node 245 is connected to voltage output node 224. In such embodiments, each gated cell 225 may have a current supply that matches the current demand of a corresponding gated circuit 242. However, in other embodiments output gated pins 227 and output non-gated pins 228 may be directly connected to one or more of circuits 242 and 243. For example, each gated cell 225 may be connected to a single gated circuit 242 by an independent connection instead of a common node. In such embodiments, output gated pins 227 and/or output non-gated pin 228 are connected directly to distinct power supply pins 247. Moreover, some embodiments, gated pins 227 may be directly connected to power supply pins 247 only if the current supply of the corresponding gated cell 225 marches the current demand of the gated circuit 242. In yet other embodiments, some cells may be connected to voltage output node 224 while other cells are connected directly to circuits 242, 243.

Figure 2B:
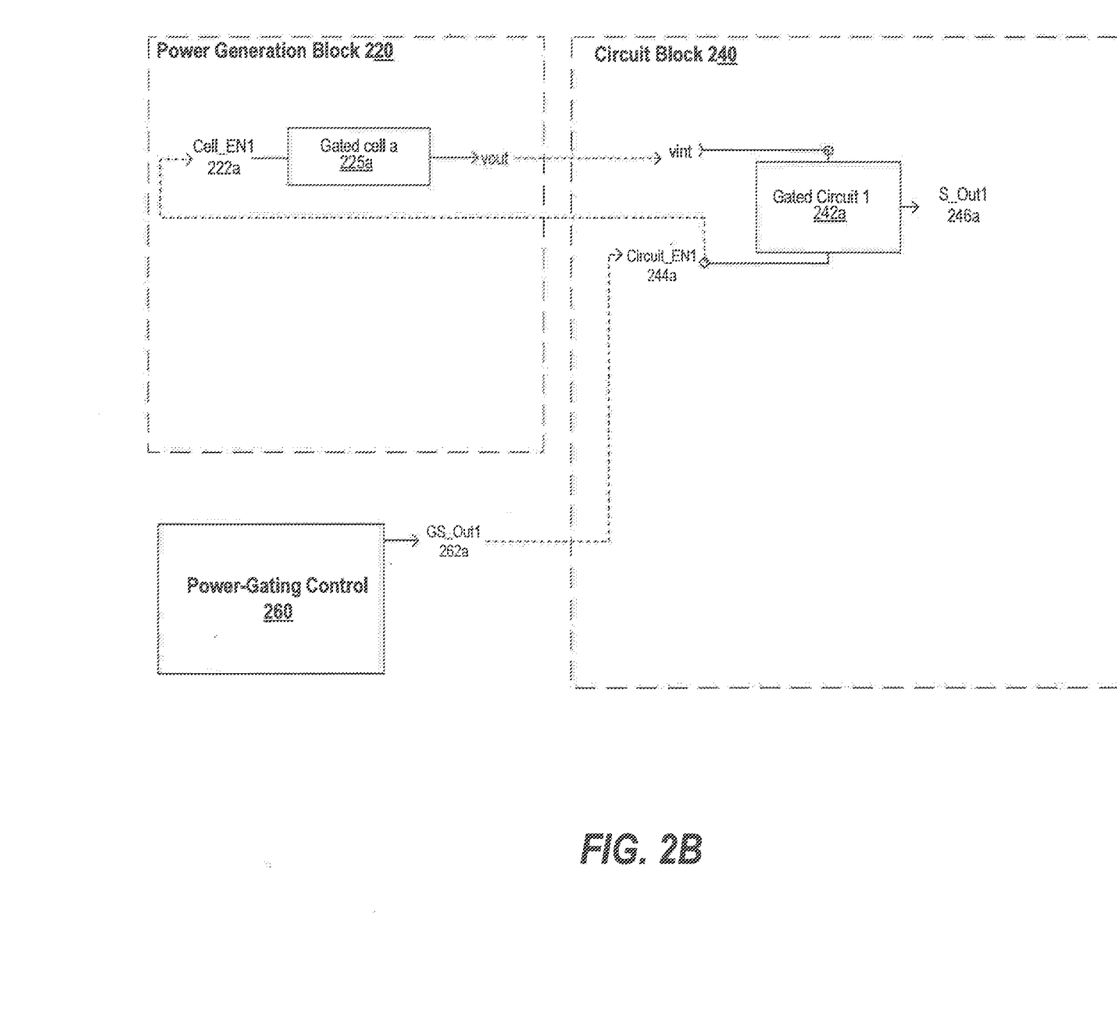
FIG. 2B is a simplified schematic diagram of an exemplary power-gating electronic system showing a serial connection.

Power-gating control 260 includes a plurality of gate signal outputs 262a, 262b, ..., 262n, collectively referred to herein as gate signal outputs 262. In some embodiments, each one of the gate signal outputs 262 is connected to one cell enabling pin 222 and one circuit enabling pin 244 in parallel. However, in other embodiments, combinations of parallel and/or serial connections between gate signal outputs 262, cell enabling pins 222, and circuit enabling pins 244 are possible. For example, instead of having the parallel connection from gate signal outputs 262 to cell enabling pins 222 and circuit enabling pins 244 shown hi FIG. 2A, in some embodiments gate signal outputs 262 may be serially connected first to cell enabling pins 222 and then to circuit enabling pins 244. In other embodiments, as shown in FIG. 2B, gate signal outputs 262 may be serially connected first to circuit enabling pins 244 and then to cell enabling pins 222.

As used herein, electrical distance, or electrical length, refers to the length of the conductor connecting two pins. In some embodiments, the electrical distances between pins may be configured to be similar in order to synchronize signals. Synchronizing signals in power-gating electronic system 200 may minimize power supply and demand mismatch and minimize noise. For example, the electrical distance between gate signal output 262a and cell enabling pin 222a, and the electrical distance between gate signal output 262a and circuit enabling pin 244a may be configured to be the same, or substantially the same.

In other embodiments, the electrical distance between pins may not be substantially the same. However, signals may still be synchronized when the propagation time between pins is similar. For example, the propagation time between gate signal output 262a and cell enabling pin 222a, and the propagation time between gate signal output 262a and circuit enabling pin 244a, may be configured to be the same, or substantially the same even if the electrical distances are different. As used herein, the propagation time or "flight time" refers to the amount of time a signal requires to travel between two different pins. The propagation time of a signal depends on the dielectric constants of propagation paths. For example, the propagation time may depend on the dielectric constant of materials surrounding a conductor. Changes in propagation time based on dielectric constants are evidenced in the propagation velocity, which is represented by equation (1):

$$v = \frac{c}{\sqrt{(\epsilon_r)}} \quad (1)$$

where, $v$ is the propagation velocity in meter per second, $\epsilon_r$ is the dielectric constant of materials in the propagation path, and c is the speed of electromagnetic waves in free space. Thus, the propagation time may be manipulated when materials with different dielectric constants are included in the propagation path between pins. For example, a buffered segment, i.e., a segment of material with a different dielectric constant, may be included in a propagation path between two pins to manipulate the propagation velocity. In some embodiments, buffered segment 272a, 272b, ..., 272n, collectively referred herein to as buffered segments 272, may optionally be included in propagation paths between gate signal outputs 262 and enabling pins 222, and between gate signal outputs 262 and circuit enabling pins 244 to have equal, or substantially equal, propagation times. Similar propagation times facilitate synchronizing delivery of signals that are generated by power-gating control 260 and are received at circuit block 240 and power generation block 220.

In some embodiments, buffered segments 272, can be included by patterning dielectrics on conductors connecting pins. For example, materials of known dielectric constant may be selectively patterned on the conductor connecting two pins to modify the propagation time. In other embodiments, in which multiple conductive layers are available between pins (e.g., in a printed circuit board), buffered segments 272 may be included by changing the conduction layer of a connection. For example, the connector between gate signal output 262a and circuit enabling pin 244a may travel through multiple conductive layers of a device. Then, the propagation time between gate signal output 262a and circuit enabling pin 244a, may be manipulated by having the conductor traveling in conductive layers with different dielectric constants. In this way, propagation time between pins may be tailored to become equivalent, or substantially equivalent. In yet other embodiments, portions of the connection between pins may include other kinds of such buffered segments 272 such as coaxial portions.

As explained above, FIG. 2B is a simplified schematic diagram of an exemplary power-gating electronic system showing a serial connection.

Figure 3:
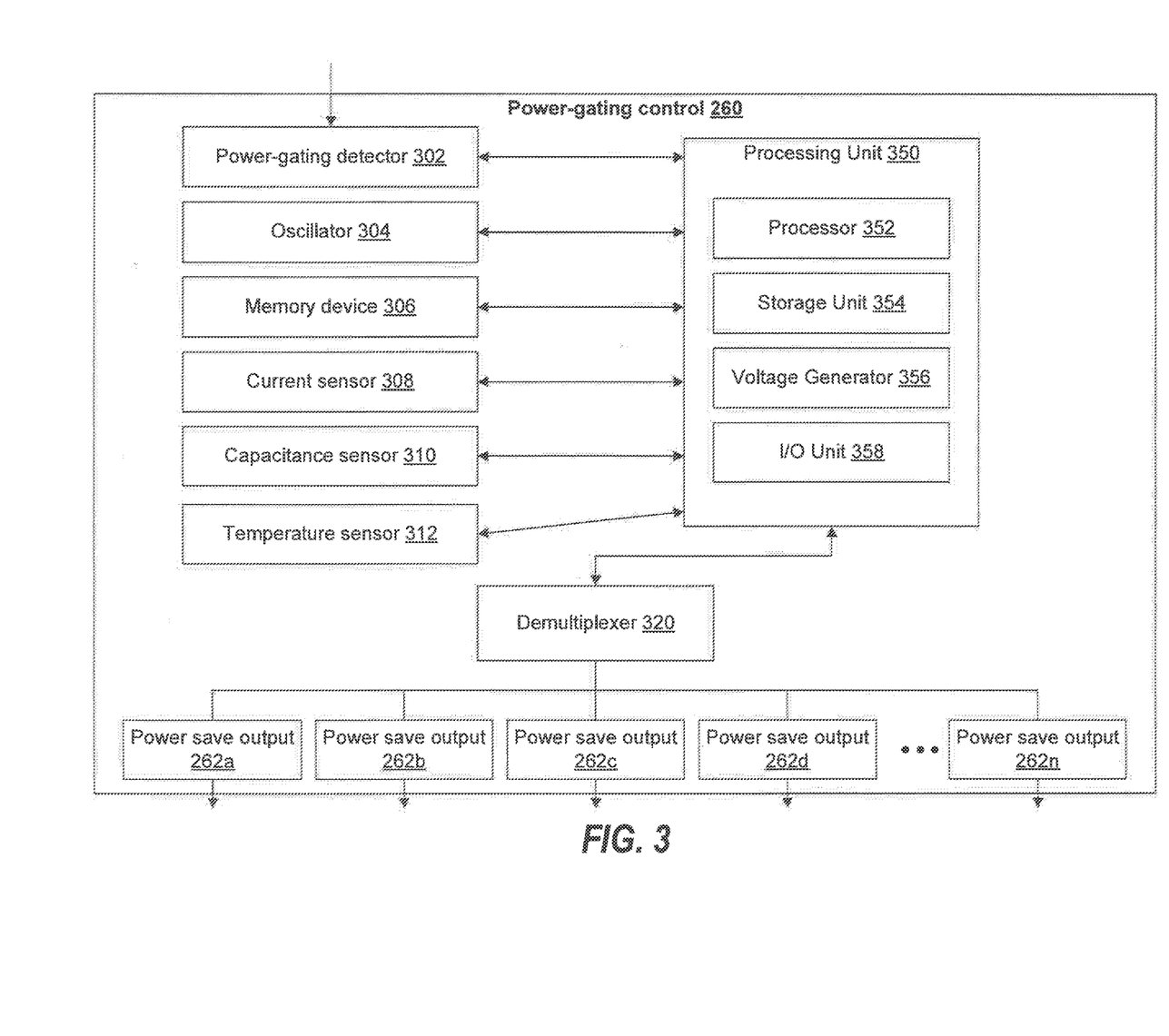
FIG. 3 is a schematic diagram of an exemplary power-gating control device.

FIG. 3 is a schematic diagram of an exemplary power-gating control 260. Exemplary power-gating control 260 includes a power-gating detector 302, an oscillator 304, a memory 306, a current sensor 308, a capacitance sensor 310, a processing unit 350, a temperature sensor 312, a demultiplexer 320, and gate signal outputs 262.

Processing unit 350 includes a processor 352, a storage unit 354, a voltage generator 356, and an I/O unit 358. Storage unit 354 is configured to store instructions executed by processor 352 to control the generation of gate signals. Processor 352 may be a general-purpose processor that can be configured to execute the instructions stored in storage unit 354. Voltage generator 356 is configured to generate various voltages for controlling the operations of other elements in power-gating control 260. I/O unit 358 is configured to communicate with other components outside processing unit 350. I/O unit 358 is configured to code signals to be transmitted from power-gating control 260 and decode signals received by power-gating control 260. In an alternative embodiment, processing unit 350 can include special-purpose logic circuits that are configured to control operations related to generating and transmitting gate-signals.

Power-gating detector 302 may be connected to an external component that communicates with power-gating control 260. Signals received by power-gating detector 302 trigger a power transition for circuits in circuit block 240 and cells in power generation block 220. For example, power-gating detector 302 may receive a plurality of digital signals that specify the number or identity of circuits and cells that need to be "powered-down" or "powered-up." In such embodiments, power-gating control 260 sends gate signals to a determined number of cells and circuits or specific cells and circuits. For example, power-gating control 260 may only power-down gated cell 225b and gated circuit 242b, without sending signals to any other circuits or cells, when power gating-detector 302 receives instructions to only power down gated circuit 242b. In other embodiments power-gating detector 302 may receive a single signal instructing power-gating control 260 to power down all gated circuits 242 and all gated cells 225. In yet other embodiments, power-gating detector 302 may receive information of circuit parameters that are used to calculate time delays.

Oscillator 304 is an electronic circuit that produces a periodic signal such a sine wave or a square wave. Oscillator 304 is connected to processing unit 350, which uses the oscillator signal to, for example, time the generation of gate signals. Oscillator 304 may be coupled and synchronized with other components of memory device 100.

Memory 306 may include a volatile or non-volatile, magnetic, semiconductor, solid-state, tape, optical, removable, non-removable, or other type of storage device or tangible (i.e., non-transitory) computer-readable medium that stores one or more program(s) and data. Data stored in memory 306 may include, for example, device information, task information, and settings and preferences. In some embodiments, data stored in memory 306 may include one or more rule sets for prioritizing and generating gate-signals. Memory 306 may also include information of parameters or weights to calculate waiting time intervals.

Current sensor 308, capacitance sensor 310, and temperature sensor 312 may be digital or analog sensors. Current sensor 308 and capacitance sensor 310 may be configured to detect currents and capacitances in circuit block 240. For example, current sensor may bridge voltage output node 224 and voltage input node 245 in order to measure the current provided by power generation block 220. In addition, capacitance sensor 310 may be connected to voltage input node 245 in order to measure circuit block 240 capacitance. Additionally, temperature sensor 312 may be positioned to monitor the temperature of the power-gating control 260, power generation block 220, and/or circuit block 240.

Demultiplexer 320 is coupled to processing unit 350. Demultiplexer 320 routes gate signals from the processing unit 350 to one of the gate signal outputs 262. For example, voltage generator 356 may generate a signal that is transmitted via I/O unit 358 and then routed via demultiplexer 320 to one of the gate signal outputs 262. In some embodiments, demultiplexer 320 may transmit a single signal at a time. In other embodiments, demultiplexer 320 may be configured to simultaneously transmit multiple signals. In some embodiments, the gate signal output 262 selected by demultiplexer 320 is related to the signal received by power-gating detector 302. For example, power-gating detector 302 may receive instructions to power-down gated circuit 242a. Accordingly, demultiplexer 320 would route a gate-signal to gate signal output 262a.

In some embodiments, demultiplexer 320 may select one of gate signal outputs 262 based on the current demand of the gated circuit 242 connected to the selected gate signal output 262. Alternatively, or additionally, demultiplexer 320 may select a gate signal output 262 based on the current supply of the gated cell 225 connected to the selected gate signal output.

Figure 4:
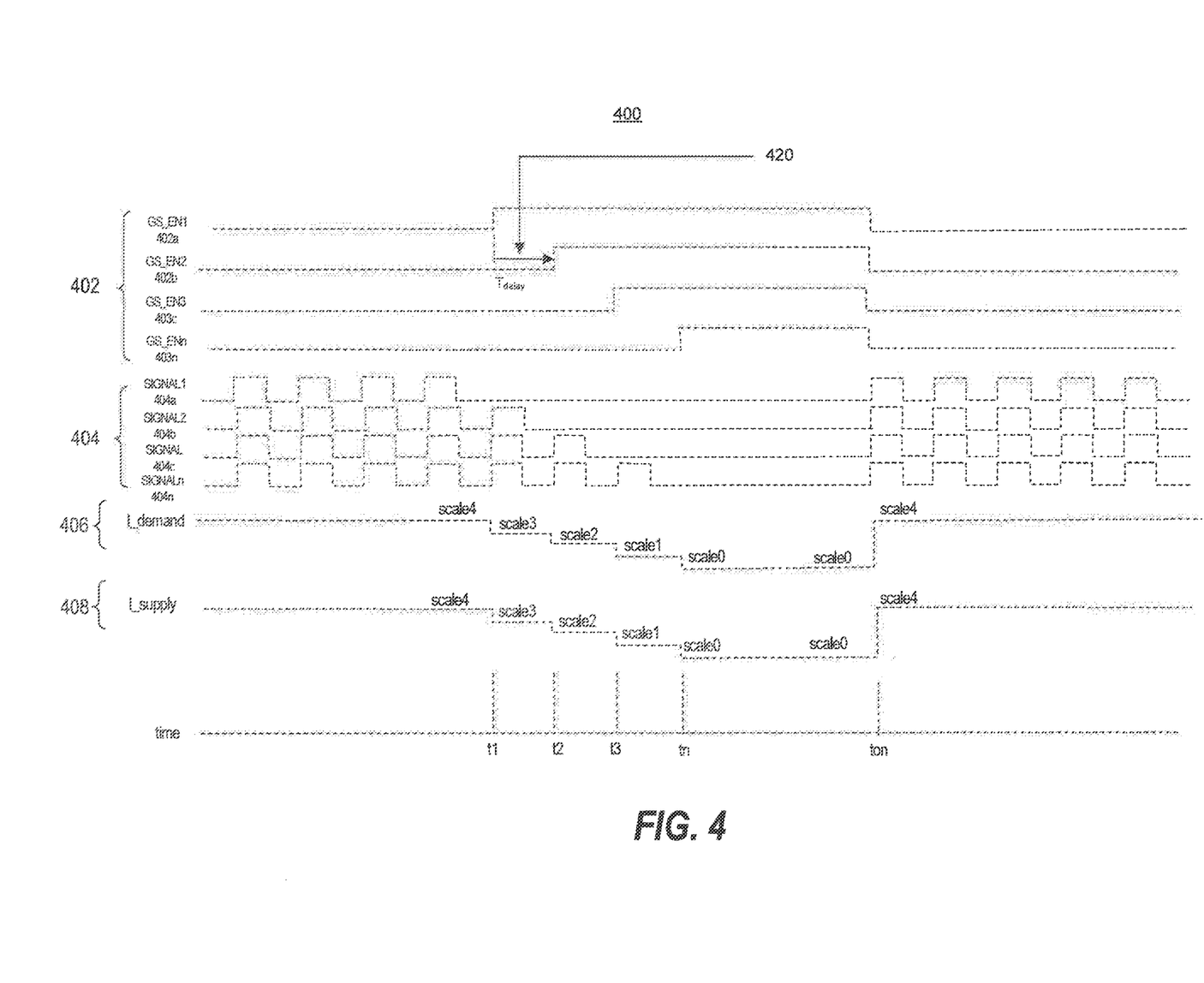
FIG. 4 is an exemplary timing diagram illustrating signals from a power-gating electronic system.

FIG. 4 is an exemplary timing diagram illustrating signals in a power-gating electronic system. Timing diagram 400 shows gate signals 402, signal outputs 404, current demand 406, and current supply 408. Additionally, timing diagram 400 shows a time delay or waiting time interval 420.

Gate signals 402 are generated by power-gating control 260 and are provided in gate signal outputs 262. Gate signals 402 may power down or power up circuits and cells of power-gating electronic system 200. Signal outputs 404 are generated by gated circuits 242 and are provided in signal output pins 246. Current supply 408 represents the current provided by power generation block 220. Current demand 406 represents the current load of circuit block 240. Alternatively, current demand 406 and current supply 408 may be the current flowing in voltage input node 245 and voltage output node 224, respectively.

In the timing diagram, if signal output 404 is fluctuating, the corresponding circuit is powered up. For example, if signal output 404a fluctuates, then gated circuit 242a is powered up. Alternatively, if signal output 404a is constantly low, it means gated circuit 242a is disabled or powered down. Moreover, in the timing diagram a high gate-signal 402 indicates that a circuit and/or cell is powered down, while a low gate-signal 402 indicates that the circuit and/or cell is powered up.

The timing diagram shows that before time t1 all gate-signals 402 are low and all signal outputs 404 are fluctuating, indicating that the circuits are powered up. Because all circuits are powered up, before time t1 the current demand 406 is at the highest magnitude (scale 4) and matches the current supply 408. At time t1, power-gating control 260 triggers a first gate-signal, which is provided in a first gate signal output 262a. As described in FIG. 2A, gate signal output 262a is connected to one cell enabling input 222a and one circuit enabling pin 244a. Thus, the first gate-signal simultaneously powers down gated cell 225a and gated circuit 242a. Therefore, in the power-gating electronic system 200 a single gate-signal 402a simultaneously deactivates one circuit and one cell. Such architecture facilitates synchronization during power transitions and minimizes noise. A synchronized power down minimizes power mismatches because deactivating a cell reduces the power supply and deactivating the circuit reduces power demand. Thus, after time t1 current demand 406 and current supply 408 are both at a scale 3, which is lower than scale 4. As described in FIG. 4, all these events occur simultaneously at time t1.

After a waiting time interval 420 lapses at time t2, power-gating control 260 generates a second gate-signal 402b that is provided in a second gate signal output 262b. Waiting time interval 420 between gating-signals 402 may be used to segment the power transitions and minimize noise caused by abrupt power demands. The second gate signal output 262b is coupled to a second cell enabling pin 222b, different from the first cell enabling pin 222a, and a second circuit enabling pin 244b different from the first circuit enabling pin 244a. Thus, gated circuit 242b and gated cell 225b are simultaneously powered down and the current demand and supply decrease to a scale 2 with minimal power supply/demand mismatch. The power-gating electronic system 200 minimizes noise by synchronizing power down of gated circuit 242b and gated cell 225b. The synchronized power down of circuits and cells is repeated after waiting time interval 420 lapses at time t3. Power-gating control 260 generates signals to deactivate a third gated circuit 242c with a corresponding third gated cell 225c and repeats the cycle 'n' times, finalizing at time tn. In each cycle, power-gating control 260 generates gate-signal 402 to simultaneously power down a cell and a circuit. In each cycle, power-gating control 260 waits waiting time interval 420 before generating gate-signal 402.

In some embodiments, as shown in FIG. 4, the waiting time intervals may be uniform. In other embodiments, however, the waiting time intervals may follow a function that decreases or increases the length of waiting time intervals. For example, when a power-down process starts, the initial waiting time intervals may be short. A single cell and a single circuit may only represent a small portion of the current supply and demand. Hence, powering off one cell and one circuit does not represent a significant current change and the circuit quickly stabilizes, allowing short intervals. However, as fewer circuits remain powered on, the proportional supply and demand changes caused by each power down is greater and longer stabilization times may be required. Thus, later waiting time intervals may be longer than initial waiting time intervals.

In other embodiments, the waiting time interval may be recalculated every time a gate signal 402 is generated. For example, after generating gate signal 402a, power-gating control 260 may read current sensor 308, capacitance sensor 310, and/or temperature sensor 312 and adjust the waiting time interval based on that information. For instance, if power-gating control 260 determines that the temperature is high, it may reduce waiting time intervals to speed power savings.

After time tn, circuits and cells are deactivated and thus current demand 406 and current supply 408 are at the lowest scale 0. At this state the circuit block is in a power-down mode in which there is reduced power consumption. In some embodiments, scale 0 may be equivalent to a zero current. However, in other embodiments, scale 0 may be a base current associated to non-gated devices.

FIG. 4 presents power down of single circuits at each waiting time interval. However, in some embodiments, more than one circuit may be simultaneously powered down. In such embodiments, power-gating control 260 may provide a signal in two or more gate signal outputs 262. For example, power-gating control 260 may apply a gate-signal to both gate signal output 262a and gate signal output 262b simultaneously, transmitting gate-signals 402 to two gated circuits 242 and two gated cells 225. These embodiments may increase noise during power transitions but may also speed up the power transitions. In addition, similarly to the above-described changes in waiting time intervals, the number of signals generated by power-gating control 260 may be also a function of time, number of remaining operating circuits, temperature, capacitance, and/or current. For example, power-gating control 260 may start applying the gate-signal to 'n' gate signal outputs 262. At a later stage of the power down process, as the ratio of supply/demand contribution of each circuit and cell increases, the power-gating control 260 may apply the gate-signal to 'n−1' gate signal outputs.

FIG. 4 shows that at time ton, all gate-signals 402 are returned to the low state. Therefore, all gated circuits 242 and all gated cells 225 are powered up simultaneously. Timing diagram 400 shows that after time ton, signal outputs 404 fluctuate, current supply 408 increases to scale 4, and current demand 406 also increases to scale 4. Thus, after time ton, a power-down and power-up cycle is completed.

While FIG. 4 presents a simultaneous power up with all gate-signals 402 decreasing at time ton, other embodiments may have stepped circuit and cell power up. For example, the same waiting time intervals between individual gate-signals 402 used during power down cycles may be used to power up circuits and cells. Also, in other embodiments, circuits may be powered up in groups. Moreover, similarly to the power down cycle, the number of circuits powered up, or the waiting time intervals during power up may be a function of current, temperature, and capacitance.

Figure 5:
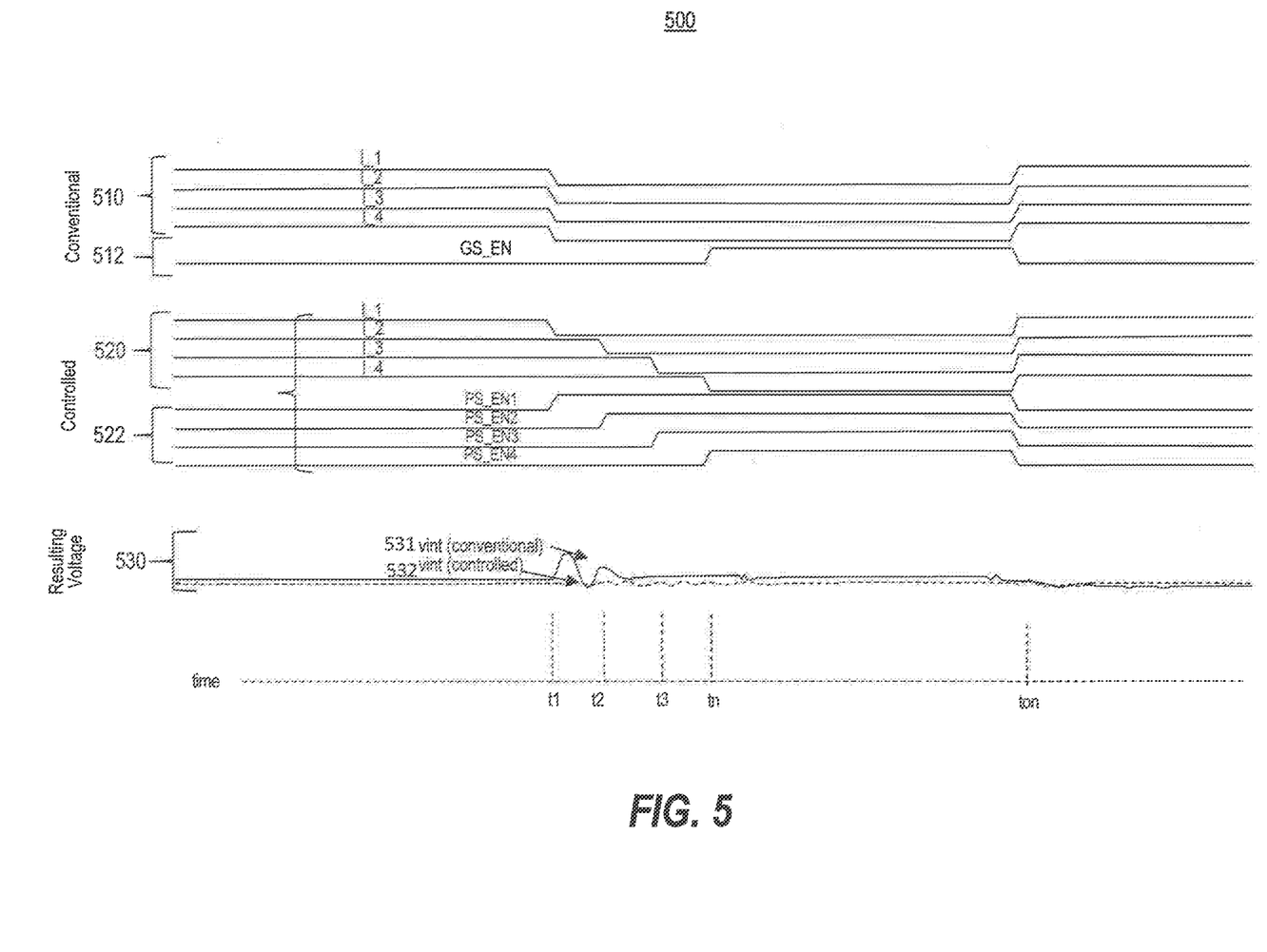
FIG. 5 is an exemplary diagram of comparative simulations performed on a power-gating electronic system.

FIG. 5 is an exemplary diagram of comparative simulations performed on a power-gating electronic system. FIG. 5 compares simulations of a conventional power-transition with a controlled power-transition consistent with embodiments of the present disclosure. The conventional power-transition simulation models a system that has a single gate signal output connected to all circuits and all cells. The controlled power-transition simulation models a system that uses the power-gating electronic system 200, in which each gated cell 225 and each gated circuit 242 share an independent gate signal output 262.

With the conventional power-transition, a conventional gate-signal 512 powers-down all circuits and cells simultaneously. Therefore, all current signals 510 decrease simultaneously. On the other hand, with controlled power-transition, circuits and cells are independently powered-down. As described with respect to the timing diagram 400 of FIG. 4, power-gating control 260 sequentially generates control gate-signals 522 to independently decreasing current signals 520.

Conventional and controlled power-down methods have different resulting voltages 530. With the conventional power-transition, the simulation yields a noisy supply voltage 531 (solid line in FIG. 5), while the controlled power-transitions yield a controlled supply voltage 532 (dashed line in FIG. 5).

In the conventional power-transition, noisy supply voltage 531 fluctuates when there is a mismatch between the current supply 408, controlled by conventional gate-signal 512, and current demand 406. This voltage noise is associated to sudden power demand changes that force power output to abruptly change to compensate the current supply and demand mismatch. The mismatch is difficult to avoid in a conventional power transition even if all gate-signals are connected to the same node. Differences in flight-time, thermal fluctuations, and/or layout or device defects, prevent accurate synchronization of the signals. Thus large voltage fluctuations, that may damage circuits and cause malfunctions, may be observed in the conventional power transition.

On the other hand, the controlled power-transition follows the sequential power down of circuits and cells described above with respect to FIG. 4. First, at time t1, a single controlled gate-signal 522 is decreased and after a waiting time interval. Second, at time t2, a second a controlled gate-signal 522 is decreased. Then, other gate signals are sequentially generated multiple times. This sequential power down results in controlled supply voltage 532, which has lower voltage fluctuations.

Reduction of noise observed in the controlled power-down is mainly attributed to two factors. First, sequential or stepwise power down of circuits limits current fluctuations by segmenting current demand/supply changes. Smaller steps in supply/demand changes enable faster stabilization and reduce current mismatch. Second, the power-gating electronic system 200 has one gate signal output 262 connected to one cell enabling pin 222 and one circuit enabling pin 244. Thus, supply and demand are synchronized because every cell is deactivated with a corresponding circuit. With the controlled power-transition the power generation block 220 always "sees" the same load for its capacity. Such arrangement minimizes transitory stages, current peaks, or ground bounces.

Figure 6:
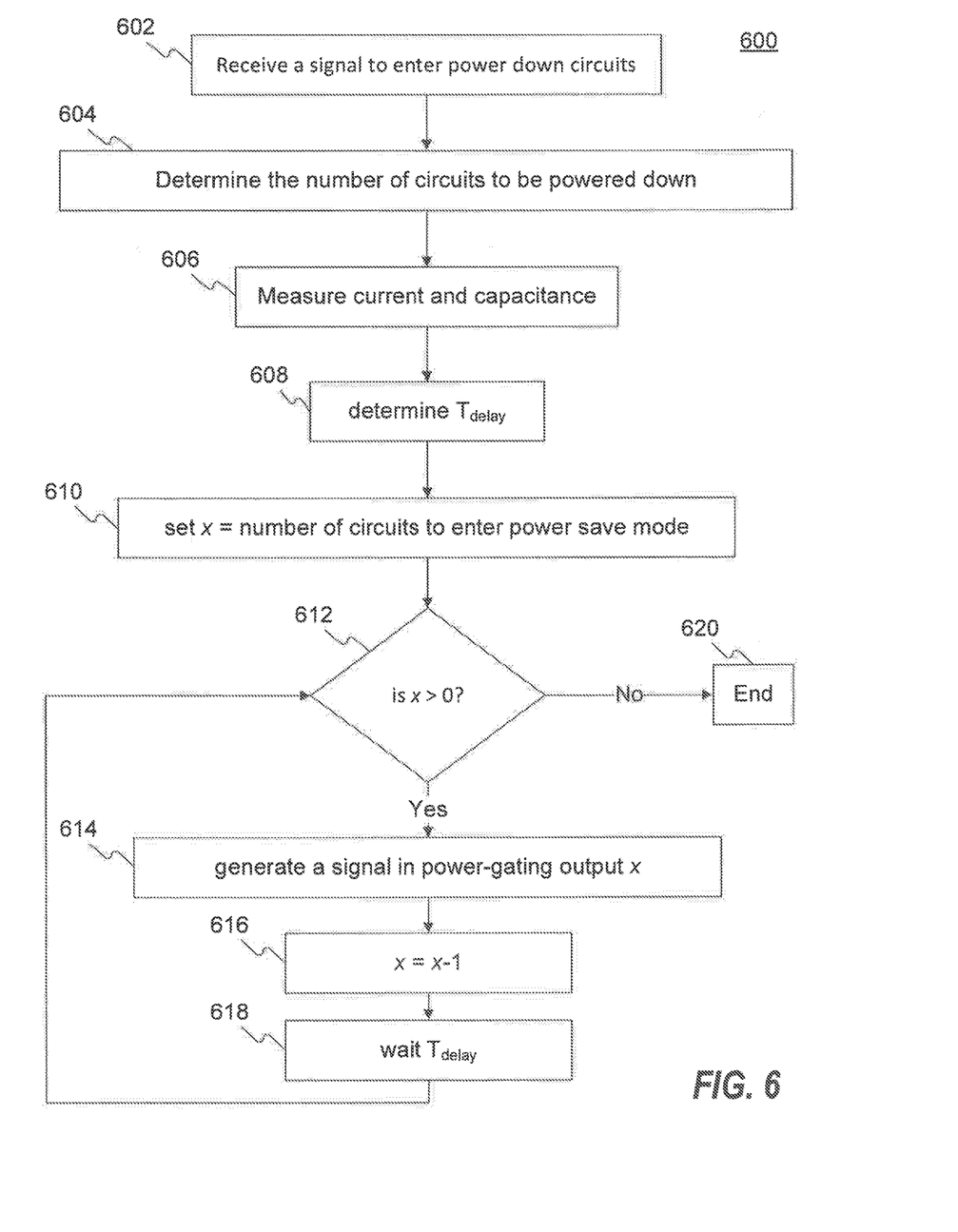
FIG. 6 is a flowchart illustrating an exemplary power-gating synchronization method according to a disclosed embodiment.

FIG. 6 is a flowchart illustrating an exemplary power-gating synchronization method 600 according to a disclosed embodiment. Method 600 can be performed by, for example, power-gating control 260.

In step 602, power-gating control 260 receives a signal to power down one or more circuits. For example, power-gating detector 302 receives a signal to power down circuits in circuit block 240. In some embodiments, the signal to power down circuits may be Boolean. In other embodiments, the signal may be a packet of information. In such embodiments, the power-down signal may include the number of circuits to be powered down or specify the identity of circuits to be powered down. In yet other embodiments, the power down signal may include a power reduction percentage. For example, the received signal to power down may indicate reduction of power to half current load.

In step 604, power-gating control 260 determines the number or the identity of circuits that will be powered down. It may do so based on information received by power-gating detector 302 in step 602 and/or the number of gated circuits on circuit block 240. For example, in step 604 power-gating controller 260 may determine that 'n' circuits will be powered down.

In step 606, power-gating control 260 captures information from current sensor 308, capacitance sensor 310, and/or temperature sensor 312. Processing unit 350 stores such information for later determinations.

In step 608, power-gating control 260 determines waiting time interval 420 that will separate gate-signals 402. Alternatively, power-gating control 260 may define a function to calculate waiting time intervals. The waiting time intervals may be determined based on a plurality of variables. In some embodiments, the waiting time interval may be associated with an externally generated clock signal received on pin dock (CLK) (FIG. 1). In other embodiments, the waiting time interval may be associated with information from current sensor 308, capacitance sensor 310, and/or temperature sensor 312. For example, waiting time interval 420 may be calculated with equation (2):

$$T_{interval} = \alpha*I + \beta*C + \gamma*T + K \quad (2)$$

where $T_{interval}$ represents waiting time interval 420, I represents measured current, C represents measured capacitance, T represents measured temperature, K represents a constant or starting interval, and $\alpha$, $\beta$, $\gamma$ represent weights that may be selected for specific applications. In some embodiments the weights may be negative. For example, $\beta$ may represent a negative factor to create an inverse relation between intervals and capacitance. In addition, a may be a positive coefficient such that higher currents result in higher waiting time intervals.

In step 610, power-gating control 260 may initialize a looping variable associated with the number of circuits to be powered down. This variable may be used to monitor iterations and assign the appropriate gate signal output 262. In step 612, if the looping variable is greater than zero, more circuits need to be powered down. Power-gating control 260 generates a new gate-signal 402 and provides it to one of the gate signal outputs 262.

In step 616 the looping variable is decremented, to reflect one circuit and cell pair have been powered down. In step 618 power-gating control 260 waits the determined waiting time interval 420, and the process returns to step 612. The power down of circuits and cells is repeated until the looping variable is equal to zero and the process is terminated at step 620.

According to the above-described embodiments, the power-transition of circuits and cells is controlled and synchronized. Therefore, the noise that is generated during power transitions is reduced. In addition, the power-transition time and noise may be improved by dynamically changing waiting time intervals and/or the number of circuits being powered in each iteration. Moreover, the above described embodiments enable accurate synchronization of signals by incorporating buffering segments in the propagation path between pins.

Another aspect of the disclosure is directed to memory device 306 storing instructions which, when executed, cause processing unit 350 to perform the methods, as discussed above. Memory device 306 may include volatile or non-volatile, magnetic, semiconductor, tape, optical, removable, non-removable, or other types of computer-readable medium or computer-readable storage devices. Alternatively, instructions may be stored in storage unit 354, as disclosed. In some embodiments, memory device 306 and/or storage unit 354 may be a disc or a flash drive having the computer instructions stored thereon.

It will be apparent to those skilled in the art that various modifications and variations can be made to the disclosed remote control system and related methods. Other embodiments will be apparent to those skilled in the art from consideration of the specification and practice of the disclosed remote control system and related methods. It is intended that the specification and examples be considered as exemplary only, with a true scope being indicated by the following claims and their equivalents.

What is claimed is:

1. A power-gating electronic system, comprising:
   a power generation block including a plurality of cells, each cell including a cell enabling input;
   a circuit block including a plurality of circuits, each circuit including a circuit enabling input; and
   a power-gating controller including a plurality of gate signal outputs,
   wherein each gate signal output is coupled to one of the cell enabling inputs and one of the circuit enabling inputs, and
   the power-gating controller is configured to sequentially generate a plurality of gate signals based on a waiting time interval, each gate signal being provided on a distinct one of the plurality of gate signal outputs.

2. The power-gating electronic system of claim 1, wherein each gate signal output is connected in series, first with the one circuit enabling input and second with the one cell enabling input.

3. The power-gating electronic system of claim 1, wherein each gate signal output is connected in parallel with the one circuit enabling input and the one cell enabling input.

4. The power-gating electronic system of claim 3, wherein a first electrical distance between a first one of the gate signal outputs and a first one of the cell enabling inputs that are connected, is substantially equal to a second electrical distance between the first gate signal output and a first one of the circuit enabling inputs that are connected.

5. The power-gating electronic system of claim 3, wherein a first propagation time between a first one of the gate signal outputs and a first one of the cell enabling inputs that are connected, is substantially equal to a second propagation time between the first gate signal output and a first one of the circuit enabling inputs that are connected.

6. The power-gating electronic system of claim 5, wherein a first signal propagation path between the first gate signal output and the first circuit enabling input and a second signal propagation path between the first gate signal output and the first cell enabling input include a buffered segment.

7. The power-gating electronic system of claim 1, wherein the power-gating controller further comprises at least one of a current sensor, a capacitor sensor, and a temperature sensor.

8. The power-gating electronic system of claim 7, wherein the power-gating controller calculates a waiting time interval based on at least one of measured current, measured capacitance, and measured temperature.

9. The power-gating electronic system of claim 1, wherein the plurality of gate signals are generated and provided in groups.

10. The power-gating electronic system of claim 1, wherein the waiting time interval is modified when a gate signal is generated.

11. The power-gating electronic system of claim 10, wherein the waiting time interval increases when a gate signal is generated.

12. The power-gating electronic system of claim 1, wherein each cell includes a cell power output and each circuit includes a circuit power input.

13. The power-gating electronic system of claim 12, wherein each cell power output is connected directly to one of the circuit power inputs.

14. The power-gating electronic system of claim 1, wherein each cell power output and each of circuit power input are connected to a voltage node.

15. A power-gating controller, comprising:
a memory device;
a control unit;
a plurality of gate signal outputs;
a power-gating detector in communication with the control unit; and
a demultiplexer coupled between the control unit and the plurality of gate signal outputs to route at least one of a plurality of gate signals to a selected one of the gate signal outputs,
wherein the memory device stores instructions that, when executed by the control unit, cause the control unit to:
determine a waiting time interval for gate signal output generation; and
sequentially generate the plurality of gate signals based on the determined waiting time interval, each gate signal being provided on a distinct one of the plurality of gate signal outputs.

16. The power-gating control of claim 15, further comprising at least one of a current sensor, a capacitance sensor, and a temperature sensor; wherein the waiting time interval is determined based on at least one of a measured current, a measured capacitance, and a measured temperature.

17. The power-gating control of claim 15 wherein the memory device further stores instructions that cause the control unit to modify the waiting time interval when a gate-signal is generated.

18. A method for operating a power-gating electronic system, the method comprising:
determining a waiting time interval for gate signal generation;
determining a number of circuits to enter a powered down mode; and
sequentially generating a plurality of gate signals based on the determined waiting time interval, each gate signal being provided on a distinct one of a plurality of gate signal outputs of a power-gating controller,
wherein each gate signal output is coupled to one cell enabling input of a cell in a power generation block and one circuit enabling input of a circuit in a circuit block.

* * * * *